United States Patent [19]

Tsujimura et al.

[11] Patent Number: 5,339,326
[45] Date of Patent: Aug. 16, 1994

[54] REFLECTOR FOR SEMICONDUCTOR LASER END-FACE AND METHOD OF MANUFACTURING THE SAME

[75] Inventors: Ayumu Tsujimura, Takatsuki; Kazuhiro Ohkawa, Hirakata; Shigeo Yoshii, Nagaokakyo; Tsuneo Mitsuyu, Hirakata, all of Japan

[73] Assignee: Matsushita Electric Industrial Co., Ltd., Ogawa, Japan

[21] Appl. No.: 112,978

[22] Filed: Aug. 30, 1993

[30] Foreign Application Priority Data

Sep. 14, 1992 [JP] Japan .................................. 4-244376

[51] Int. Cl.$^5$ .............................................. H01S 3/19
[52] U.S. Cl. ........................................ 372/49; 372/99
[58] Field of Search .................................. 372/49, 99

[56] References Cited

U.S. PATENT DOCUMENTS

| 4,510,607 | 4/1985 | Garcia et al. | 372/49 |
| 4,581,744 | 4/1986 | Takamiya et al. | 372/92 |
| 4,729,633 | 3/1988 | Miyagawa | 350/166 |
| 4,852,112 | 7/1989 | Kagawa et al. | 372/49 |
| 4,856,019 | 8/1989 | Miyata et al. | 372/99 |
| 4,951,291 | 8/1990 | Miyauchi et al. | 372/49 |
| 4,966,438 | 10/1990 | Mouchart et al. | 350/173 |
| 4,975,922 | 12/1990 | Sakane et al. | 372/49 |

*Primary Examiner*—Georgia Y. Epps
*Attorney, Agent, or Firm*—Fish & Richardson

[57] ABSTRACT

The invention provides a reflector for a semiconductor device which oscillates in the region from the near infrared region to the visible and short wavelength region, and a method of manufacturing the reflector. With an RF magnetron sputtering apparatus, a dielectric reflector of deposited films is formed on an end-face of a ZnSe semiconductor laser device. The deposited films are formed by 3 repetitions of alternately depositing an $SiO_2$ film and a $TiO_2$ film which each has an optical thickness of a quarter of the oscillating wavelength of the semiconductor laser device such that a reflectance at the oscillating wavelength of the laser device is over 90%. The dielectric reflector improves current—light output characteristics of the laser device compared to a conventional semiconductor laser device provided with no dielectric reflector.

11 Claims, 2 Drawing Sheets

REFLECTOR FOR SEMICONDUCTOR LASER END-FACE AND METHOD OF MANUFACTURING THE SAME

FIELD OF THE INVENTION

This invention relates to a reflector for an end-face of a short wavelength semiconductor laser and a method of manufacturing the reflector. The reflector is to be made of an optoelectronic material.

BACKGROUND OF THE INVENTION

For the first time, a reference Appl. Phys. Lett. Vol. 59 (1991), p.1272, reported pulse oscillation of 490 nm (blue-green) at 77 K by a II-VI group compound semiconductor laser of ZnCdSe/ZnSe single quantum-well (SQW) structure, which oscillates in the visible short-wavelength region. This report said that the reflector for an optical resonator of the laser used the cleavage plane originating from the crystal cleavage as it was. The reflectance at the end-faces was about 20%, the threshold current in the oscillation was 74 mA, and the threshold current density was 320 A/cm$^2$.

Further, Jpn. J. Appl. Phys. Vol. 29 (1990) p.L205 disclosed that a III-V group compound semiconductor, GaN, produced a stimulated emission of a 375 nm near-ultraviolet light by light emission at room temperature. The threshold excitation density was 700 kW/cm$^2$ and the equivalent current density reached 210 kA/cm$^2$. The reflector for an optical resonator also used a cleavage plane as it was. The reflectance at the end-face was 25% or less.

Moreover, an experiment on a near ultraviolet light emitting diode of a pn Junction type GaN was reported by the 11th Symposium Record of Alloy Semiconductor Physics and Electronics (1992) p.127.

On the other hand, for conventional III-V group compound semiconductor red lasers, which show an oscillating wavelength of 670 to 690 nm, the reflectance at the end-faces has been optimized by forming an alternately deposited multilayer film of, for example, amorphous Si and SiO$_2$ on a cleavage plane of a device. The formation of the film was done with sputtering method, vacuum deposition, chemical vapor deposition or the like.

Direct use of the cleavage plane of a device as a reflector increases the threshold current due to low reflectance of the reflector, and it cannot effectively extract laser output. Consequently, to optimize the reflectance, a reflector of semiconductors, metals or dielectrics must be formed on the end-faces.

It is, however, difficult to apply the kind of reflector used in the III-V group compound semiconductor laser to a short-wavelength semiconductor laser because these semiconductor lasers differ from each other in the oscillating wavelength region. A reflector of, for example, amorphous Si, increases the imaginary component of a complex refractive index at 500 nm to near the real number of the index; this reflector absorbs emitted light and increases the threshold current. It causes optical damage by the laser light to the end-faces of the device. Although a reflector of a metal such as gold (Au) is a good reflector having no absorption in the infrared region, we cannot use it because it exhibits a large absorption in the region of wavelength shorter than the visible wavelength. Furthermore, laser behavior depends upon factors such as (i) the difference in thermal expansion coefficients between a reflector material and the device, (ii) adhesion of the reflector to the device, (iii) crystallization of the reflector, (iv) hardness of the reflector, (v) wet-proofness of the reflector, (vi) stability of the reflector, and the like. These factors cause in particular strain in an active layer of the device, and optical damage to the device. They are also practically important. Therefore, we need to optimize the factors.

The invention aims to provide a reflector essential to the best behavior of a semiconductor device which oscillates in the region from the near infrared region to the visible and short wavelength region, and a method of manufacturing the reflector.

SUMMARY OF THE INVENTION

A first purpose of the invention is to provide a reflector for an end-face of a semiconductor laser device comprising at least two dielectric films having a refractive index different from each other deposited on the end-face of a semiconductor laser device having an oscillating wavelength from 370 to 600 nm.

It is preferable in the invention that the semiconductor laser device is formed of a II-VI group compound.

It is preferable in the invention that the II-VI group compound is used as a single substance or a mixed crystal of at least one compound selected from zinc sulfide (ZnS), zinc selenide (ZnSe), zinc telluride (ZnTe), cadmium sulfide (CdS) and cadmium selenide (CdSe).

It is preferable in the invention that the dielectric films comprise a first film formed of at least one substance selected from the group consisting of calcium fluoride (CaF$_2$), magnesium fluoride (MgF$_2$), thorium (IV) fluoride (ThF$_4$), silicon dioxide (SiO$_2$) and aluminum oxide (Al$_2$O$_3$), and a second film formed of at least one substance selected from the group consisting of zinc sulfide (ZnS), zirconlure (IV) oxide (ZrO$_2$), hafnium (IV) oxide (HfO$_2$), cerium (IV) oxide (CeO$_2$) and titanium (IV) oxide (TiO$_2$), the first and second films being alternately deposited one over another.

It is preferable in the invention that the dielectric films each have an optical thickness equal to a quarter of an oscillating wavelength of the semiconductor laser device.

It is preferable in the invention that the number of the dielectric films alternately deposited is from 4 to 30.

A second purpose of the invention is to provide a method of manufacturing a reflector for an end-face of a semiconductor laser device comprising the steps of alternately and continuously depositing at least two dielectric films one over another on an end-face of a II-VI group compound semiconductor laser device in a vacuum chamber.

It is preferable in the invention that the dielectric films are deposited on a substrate kept at a temperature from 20° to 150 °C.

It is preferable in the invention that the steps of alternately and continuously depositing at least two dielectric films comprise 2 to 10 repetitions of depositing a first dielectric film to an optical thickness equal to a quarter of an oscillating wavelength of the semiconductor laser device and depositing a second dielectric film to the same optical thickness as that of the first dielectric film.

It is preferable in the invention that the first dielectric film and the second dielectric film are formed of a first compound and a second compound, respectively, and the first and second compounds are selected from the pairs of SiO$_2$ and TiO$_2$; SiO$_2$ and ZrO$_2$; SiO$_2$ and ZnS;

MgF$_2$ and ZnS; ThF$_4$ and ZnS; MgF$_2$ and CeO$_2$; CaF$_2$ and TiO$_2$; CaF$_2$ and HfO$_2$; and Al$_2$O$_3$ and TiO$_2$.

DETAILED DESCRIPTION OF THE INVENTION

Figure 1:
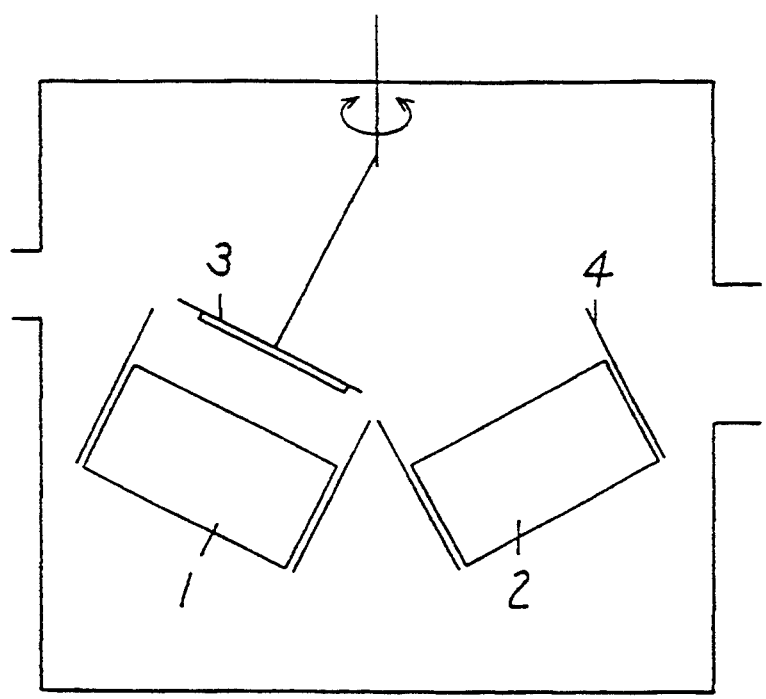
FIG. 1 is a schematic/sectional view of a reflector-manufacturing apparatus according to one embodiment of the invention.

Dielectrics are insulating and transparent since they have no absorption generally in a region from the near ultraviolet region to the infrared light region. Use of dielectrics as reflectors on the end-faces of a semiconductor laser device having an oscillating wavelength from 370 to 600 nm reduces the oscillating threshold and allows operation of the device with a smaller current. Further, since the reflector absorbs no laser light, it can protect the end-faces from damage by heat and by photoelectricity, thereby extracting a larger laser output.

The reason we think that a dielectric multilayer film works as a reflector is as follows.

When different media transmit light, reflection occurs at their interfaces. If a thin film with a refractive index $n_1$ and a thickness of $d_1$ is set between a medium of a refractive index $n_0$ and another medium of a refractive index $n_2$, light of a wavelength $\lambda$ will repeatedly reflect at both interfaces of the film, causing complex interference. As a result, a synthesis amplitude refractive index $r_{12}$ can be represented by Formula (1):

$$r_{12} = (r_1 + r_2 e^{-if})/(1 + r_1 r_2 e^{-if}) \quad \text{Formula (1)}$$

where $r_1$ and $r_2$ denote Fresnel's reflection coefficient for each interface, f denotes a delay of the phase of the light reciprocating in the thin film, and i denotes the imaginary number unit.

In a case of vertical incidence, f can be expressed by Formula (2):

$$f = (4\pi/\Xi) n_1 d_1 \quad \text{Formula (2)}$$

Further, $r_1$ and $r_2$ are expressed by Formulas (3) and (4), respectively.

$$r_1 = (n_0 - n_1)/(n_0 + n_1) \quad \text{Formula (3)}$$

$$r_2 = (n_1 - n_2)/(n_1 + n_2) \quad \text{Formula (4)}$$

The above formulas determine the energy reflectance $R_1$ at the surface of the film as shown in Formula (5):

$$R_1 = r_{12} \cdot r_{12}^* = [r_{12}]^2 \quad \text{Formula (5)}$$

The phase change by reflection is expressed as $\pi$ when light is incident from a low refractive index region to a high refractive index region whereas it is expressed as 0 when light is incident in the opposite direction. With a film exhibiting $f = \pi$, it has an optical thickness $n_1 d_1$ of $\lambda/4$ to vertical incident light; incident light from both interfaces are in phase in the case of $n_0 < n_1$, and $N_2 < n_1$, resulting in high reflectance.

A $\lambda/4$ multilayer film of high and low refractive indexes permits the Fresnel's reflection coefficient to turn alternately between positive and negative at every interface, so the reciprocating optical path difference of each film comes to be $\pi$. Consequently, most reflecting light is in phase relative to light of a wavelength $\lambda$, and the reflectance of the resulting multilayer film rises with increasing number of the deposited layers.

One can make the dielectric multilayer film having a reflection plane with a desired spectral response by appropriately selecting a refractive index, thickness and the number of depositing layers. Thus, the dielectric multilayer film of the invention is not limited to a $\lambda/4$ alternately deposited multilayer film.

From the standpoint of differences in thermal expansion coefficients between a reflector material and a semiconductor laser device, adhesion of the reflector to the device, crystallization, hardness, wet-proofness and stability, it is preferable to use low refractive index materials such as CaF$_2$, MgF$_2$, ThF$_4$, SiO$_2$, Al$_2$O$_3$ or the like; and high refractive index materials such as ZnS, ZrO$_2$, HfO$_2$, CeO$_2$, TiO$_2$ or the like. The former materials largely differ from the latter ones in refractive indices; hence a high reflectance is obtained using the former material in a combination with the latter material even though the film does not include very many layers.

The method of the invention allows us to produce a high quality reflector in a vacuum chamber without exposing the dielectric films to air. The term "high quality" means that products are sufficiently free from various disadvantages in every process, for example, contamination, cracks, and variations in composition and density, all of which contribute to light loss, that the products are clean, smooth and constant in quality.

Substrate temperatures during the deposition are important to form a high quality reflector. Needless to say, they must be below the growth temperatures of semiconductor laser crystals; high temperatures are preferable for densification of the dielectric multilayer film. However, when a semiconductor laser device is operated at room temperature, low temperatures are preferable since a large difference between the device and the film in thermal expansion brings about strain. That is why temperatures from 20° to 150° C. are preferable as a substrate temperature.

The dielectric film can be deposited by, for example, a vacuum deposition technique such as electron-bombardment or resistive heating; the high frequency (RF) sputtering method; low pressure plasma polymerization, or the like.

Further, desired high reflectances of 80 to 99% are effectively provided by 2 to 10 repetitions of alternately depositing SiO$_2$ and TiO$_2$, in that order, so that the optical thickness of every film comes to be a quarter of the oscillating wavelength of the semiconductor laser device (though it depends on the refractive index of the semiconductor laser device). Reflectances of 80 to 99% are similarly attained by 2 to 10 repetitions of the above deposition process using alternating films of SiO$_2$ and ZnS; MgF$_2$ and ZnS; ThF$_4$ and ZnS; or CaF$_2$ and TiO$_2$.

Like reflectances are attained by 3 to 10 repetitions of the above deposition process using SiO$_2$ and ZrO$_2$; CaF$_2$ and HfO$_2$; or Al$_2$O$_3$ and TiO$_2$, as well.

In a case of using MgF$_2$ and CeO$_2$, the same deposition process is preferably repeated 2 to 5 times for reflectances of 80 to 99%. The invention will be explained in further detail with reference to the following Examples and the accompanying drawings.

Example 1

With an RF magnetron sputtering apparatus as shown in FIG. 1, we formed a reflector of $SiO_2$—$TiO_2$ films alternately deposited on a ZnSe II–VI group compound semiconductor laser device.

An $SiO_2$ glass target 1 and a $TiO_2$ target 2 were used as sputtering sources. A holder 3 was fixed above either the $SiO_2$ glass target 1 or the $TiO_2$ target 2 with a rotation shaft connected directly with the holder 3. A computer controlled the position and holdup time of the holder 3 above the targets. Shields 4 were set at each target, preventing contamination in the deposition processes.

Figure 2:
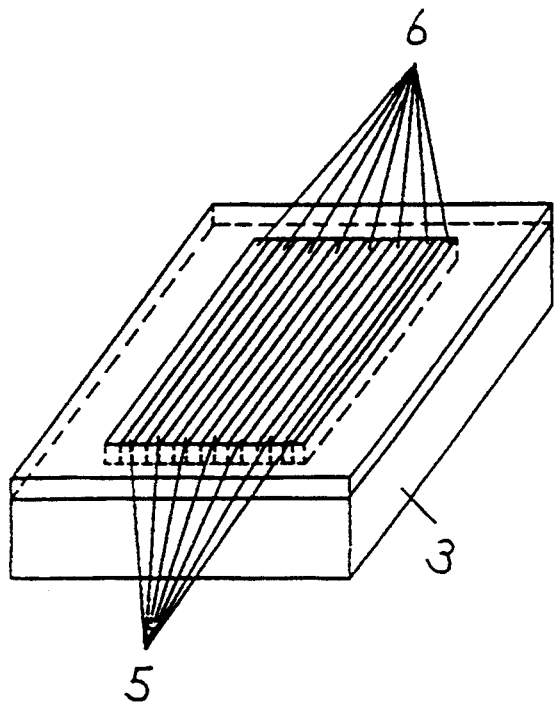
FIG. 2 is a schematic illustration of laser wafers fixed in a holder of the reflector-manufacturing apparatus.

Referring to FIG. 2, laser wafers 5 cleaved into a bar with a width of a cavity length (700 μm) were fixed on the holder 3 with their cleavage planes on which an intended reflector would form being faced upward. Every two adjacent wafers had a bar-shaped spacer 6 put therebetween.

This embodiment used a ZnSe laser device having an oscillating wavelength of 483 nm at 77 K. Sputtering gases used were argon gas at a flow of 2 sccm and oxygen gas at a flow of 0.3 sccm; and the gas pressure was 1.0 Pa. The substrate temperature was 110° C., and the applied power to each of the $SiO_2$ glass target 1 and the $TiO_2$ target 2 was 100 W. The resulting $SiO_2$ film and $TiO_2$ film in the oscillating wavelength region exhibited a refractive index of 1.45 and 2.35, respectively.

The holder 3 was held above the $SiO_2$ target 1 for 280 sec to deposit an 83 nm thick $SiO_2$ film on an end-face of the wafer. The holder 3 was then rotated to the $TiO_2$ target 2 and was held for 350 sec to deposit a 51 nm thick $TiO_2$ film. We repeated three times the above process of alternately depositing an $SiO_2$ film and a $TiO_2$ film on the end-face of the wafer to form a reflector of a λ/4 alternately deposited multilayer film on the end-face of the laser wafer. The maximum reflectance of 92% was exhibited at 485 nm on a dielectric reflector plane, and a reflectance of 90% was attained in a wide region of 460 to 520 nm. On the contrary, a simply cleaved plane on which no reflector had been formed exhibited a reflectance of 21% at 483 nm.

The laser wafers 5 were divided into individual pieces, and they were mounted on a heat sink with another end-face on which no dielectric reflector had been formed toward the laser light source.

Figure 3:
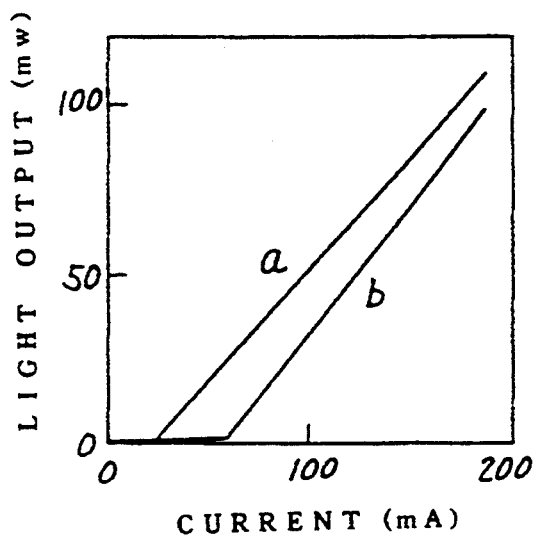
FIG. 3 shows the current—light output characteristic of a semiconductor laser device according to one embodiment of the invention.

FIG. 3 (a) shows the current—light output characteristics of 1 kHz current injections repeated at 77 K and a pulse width of 1 μs. For comparison, the same characteristics of a conventional semiconductor laser device having no dielectric reflector are shown in FIG. 3(b). The conventional one offered a threshold current of 60 mA and a threshold current density of 430 $A/cm^2$. On the other hand, the laser device of the present embodiment exhibited a threshold current of 25 mA and a threshold current density of 180 $A/cm^2$, which were less than half compared to the conventional device. The laser device of the present embodiment had a lower differential quantum efficiency since the reflection loss was smaller. Pulse driving at 300 K of the laser device where a dielectric reflector was formed on each of both end-faces with the above method confirmed laser oscillation at 503 nm, which exhibited a threshold current of 240 mA and a threshold current density of 1.7 $kA/cm^2$.

When we changed the number of repetitions of alternately depositing an $SiO_2$ film and a $TiO_2$ film from 2 to 10, the reflectance varied from 80.0 to 99.7%, accordingly. The threshold current of the laser oscillation decreased with increasing reflectance.

We did not detect cracks, strains or absorption caused by impurities in use of a reflector made by ten repetitions of the alternate deposition. Reflectors free from cracks and strains were formed within substrate temperatures from 20° to 150° C.

Example 2

With the RF magnetron sputtering apparatus, we formed a reflector of $SiO_2$—$ZrO_2$ films alternately deposited on a ZnSSe II–VI group compound semiconductor laser device.

An $SiO_2$ glass target 1 and a $ZrO_2$ target 2 were used as sputtering sources. The ZnSSe semiconductor laser device used was anticipated to have an oscillating wavelength of 519 nm at 300 K.

The sputtering gas used was argon gas at a flow of 2 sccm and oxygen gas at a flow of 0.3 sccm, and its gas pressure was 1.0 Pa. The substrate temperature was 150° C., and the applied power to each of the $SiO_2$ glass target 1 and the $ZrO_2$ target 2 was 100 W. The resulting $SiO_2$ film and $ZrO_2$ film in the oscillating wavelength region exhibited a refractive index of 1.45 and 2.01, respectively.

The holder 3 was held above the $SiO_2$ target 1 for 320 sec to deposit an 89 nm thick $SiO_2$ film on an end-face of the wafer. The holder 3 was then rotated to the $ZrO_2$ target 2 and held for 490 sec to deposit a 65 nm thick $ZrO_2$ film. We repeated four times the above process of alternately depositing an $SiO_2$ film and a $TiO_2$ film on the end-face of the wafer to form a reflector of a λ/4 alternately deposited multilayer film on the end-face of the laser wafer. A reflectance of 90% was attained at 519 nm.

Pulse driving at 300 K of the laser device where a similar dielectric reflector was formed on the other end-face confirmed laser oscillation at 519 nm, which exhibited a threshold current of 170 mA and a threshold current density of 1.5 $kA/cm^2$.

When we changed the number of repetitions of alternately depositing an $SiO_2$ film and a $ZrO_2$ film from 3 to 10, the reflectance varied from 81.0 to 99.8%, accordingly. The threshold current of the laser oscillation decreased with increasing reflectance.

We did not detect cracks, strains or absorption caused by impurities in use of a reflector made by ten repetitions of the alternate deposition, confirming that the reflector was of high quality for the semiconductor laser device. Though the reflectance reduced at substrate temperatures of 90° C. or below, no cracks and strains were detected.

Example 3

With the RF magnetron sputtering apparatus, we formed a reflector of $SiO_2$—ZnS films alternately deposited on a ZnSSe II–VI group compound semiconductor laser device.

An $SiO_2$ glass target 1 and a ZnS target 2 were used as sputtering sources. The ZnSSe semiconductor laser device used was anticipated to have an oscillating wavelength of 531 nm at 300 K. The sputtering gas used was argon gas at a flow of 2 sccm, and its gas pressure was 1.0 Pa. The substrate temperature was 60° C., and the applied powers to the $SiO_2$ target 1 and the ZnS target 2 were 100 W and 40 W, respectively. The resulting $SiO_2$ film and ZnS film in the oscillating wavelength region exhibited a refractive index of 1.45 and 2.30, respectively.

The holder 3 was held above the $SiO_2$ target 1 for 320 sec to deposit a 91 nm thick $SiO_2$ film on an end-face of the wafer. The holder 3 was then rotated to the ZnS target 2 and held for 400 sec to deposit a 58 nm thick ZnS film. We repeated three times the above process of alternately depositing an $SiO_2$ film and a ZnS film on the end-face of the wafer to form a reflector of a $\lambda/4$ alternately deposited multilayer film on the end-face of the laser wafer. A reflectance of 91% was attained at 531 nm.

Pulse driving at 300 K of the laser device where a similar dielectric reflector was formed on the other end-face confirmed laser oscillation at 531 nm, which exhibited a threshold current of 250 mA and a threshold current density of 2.1 $kA/cm^2$.

When we changed the number of repetitions of alternately depositing an $SiO_2$ film and a ZnS film from two to ten, the reflectance varied from 79.0 to 99.98%, accordingly. The threshold current of the laser oscillation decreased with increasing reflectance.

We did not detect cracks, strains or absorption caused by impurities in use of a reflector made by ten repetitions of the alternate deposition, confirming that the reflector was of high quality for the semiconductor laser device. Reflectors free from cracks and strains were formed within substrate temperatures from 20° to 150° C.

Example 4

With an electron beam evaporating apparatus, we formed a reflector of $MgF_2$ —ZnS films alternately deposited on a ZnSe II–VI group compound semiconductor laser device.

An $MgF_2$ target 1 and a ZnS target 2 were used as evaporating sources. The ZnSe semiconductor laser device used was anticipated to have an oscillating wavelength of 516 nm at 300 K.

The degree of vacuum was $1.0 \times 10^{-4}$ Pa, the substrate temperature was 120° C., and the evaporation rate was 0.5 nm/sec. The resulting $MgF_2$ film and ZnS film in the oscillating wavelength region exhibited a refractive index of 1.38 and 2.27, respectively. First, a 93 nm thick $MgF_2$ film was deposited on an end-face of a wafer. Then, a 57 nm thick ZnS film was deposited thereon. We repeated three times the above process of alternately depositing an $MgF_2$ film and a ZnS film on the end-face of the wafer to form a reflector of a $\lambda/4$ alternately deposited multilayer film on the end-face of the laser wafer. A reflectance of 93% was attained at 516 nm.

Pulse driving at 300 K of the laser device where a similar dielectric reflector was formed on the other end-face confirmed laser oscillation at 516 nm, which exhibited a threshold current of 130 mA and a threshold current density of 1.5 $kA/cm^2$.

When we changed the number of repetitions of alternately depositing an $MgF_2$ film and a ZnS film from two to ten, the reflectance varied from 82.0 to 99.99%, accordingly. The threshold current of the laser oscillation decreased with increasing reflectance.

We did not detect cracks, strains or absorption caused by impurities in a reflector made by ten repetitions of the alternate deposition, confirming that the reflector was of high quality for the semiconductor laser device. Reflectors free from cracks and strains were formed within substrate temperatures from 20° to 150° C.

Example 5

With the electron beam evaporating apparatus, we formed a reflector of $ThF_4$ —ZnS films alternately deposited on a ZnSSe II–VI group compound semiconductor laser device.

A $ThF_4$ target 1 and a ZnS target 2 were used as evaporating sources. The ZnSe semiconductor laser device used was anticipated to have an oscillating wavelength of 519 nm at 300 K.

The degree of vacuum was $1.0 \times 10^{-4}$ Pa, the substrate temperature was 120° C., and the evaporation rate was 0.5 nm/sec. The resulting $ThF_4$ film and ZnS film in the oscillating wavelength region exhibited a refractive index of 1.50 and 2.27, respectively.

First, a 93 nm thick $ThF_4$ film was deposited on an end-face of a wafer. Then, a 57 nm thick ZnS film was deposited thereon. We repeated three times the above process of alternately depositing a $ThF_4$ film and a ZnS film on the end-face of the wafer to form a reflector of a $\lambda/4$ alternately deposited multilayer film on the end-face of the laser wafer. A reflectance of 93% was attained at 519 nm.

Pulse driving at 300 K of the laser device where a similar dielectric reflector was formed on the other end-face confirmed laser oscillation at 519 nm, which exhibited a threshold current of 130 mA and a threshold current density of 1.5 $kA/cm^2$.

When we changed the number of repetitions of alternately depositing a $ThF_4$ film and a ZnS film from two to ten, the reflectance varied from 82.0 to 99.99%, accordingly. The threshold current of the laser oscillation decreased with increasing reflectance.

We did not detect cracks, strains, and absorption caused by impurities in use of a reflector made by ten repetitions of the alternate deposition, confirming that the reflector was of high quality for the semiconductor laser device. Reflectors free from cracks and strains were formed within substrate temperatures from 20° to 150° C.

Example 6

With the electron beam evaporating apparatus, we formed a reflector of $MgF_2$ —$CeO_2$ films alternately deposited on a ZnSe II–VI group compound semiconductor laser device.

An $MgF_2$ target 1 and a $CeO_2$ target 2 were used as evaporating sources.

The ZnSe semiconductor laser device used was anticipated to have an oscillating wavelength of 516 nm at 300 K.

The degree of vacuum was $1.0 \times 10^{-4}$ Pa, the substrate temperature was 120° C., and the evaporation rate was 0.5 nm/sec. The resulting $MgF_2$ film and $CeO_2$ film in the oscillating wavelength region exhibited a refractive index of 1.38 and 2.31, respectively.

First, a 93 nm thick $MgF_2$ film was deposited on an end-face of a wafer. Then, a 56 nm thick $CeO_2$ film was deposited thereon. We repeated three times the above process of alternately depositing an $MgF_2$ film and a $CeO_2$ film on the end-face of the wafer to form a reflector of a $\lambda/4$ alternately deposited multilayer film on the end-face of the laser wafer. A reflectance of 93% was attained at 516 nm.

Pulse driving at 300 K of the laser device where a similar dielectric reflector was formed on the other end-face confirmed laser oscillation at 516 nm, which exhibited a threshold current of 130 mA and a threshold current density of 1.5 kA/cm$^2$.

When we changed the number of repetitions of alternately depositing an MgF$_2$ film and a CeO$_2$ film from 2 to 5, the reflectance varied from 83.0 to 99.1%, accordingly. The threshold current of the laser oscillation decreased with increasing reflectance.

This time, we detected cracks in a reflector made by ten repetitions of the alternate deposition. Large stress was thought to occur due to differences in thermal expansion coefficients between the alternately deposited films and the semiconductor device. Consequently, 5 or fewer repetitions of alternately depositing an MgF$_2$ film and a CeO$_2$ film are preferable. The reflectance remarkably decreased at substrate temperatures of 50° C. or below.

Example 7

With the RF magnetron sputtering apparatus, we formed a reflector of CaF$_2$ —TiO$_2$ films alternately deposited on a ZnSSe II-VI group compound semiconductor laser device.

A CaF$_2$ target 1 and a TiO$_2$ target 2 were used as sputtering sources. The ZnSSe semiconductor laser device used was anticipated to have an oscillating wavelength of 519 nm at 300 K.

The sputtering gas used was argon gas at a flow of 2 sccm whose gas pressure was 1.0 Pa. The substrate temperature was 90° C., and the applied powers to the CaF$_2$target 1 and the TiO$_2$target 2 were 60 W and 100 W, respectively. The resulting CaF$_2$ film and TiO$_2$ film in the oscillating wavelength region exhibited a refractive index of 1.40 and 2.32, respectively.

The holder 3 was held above the CaF$_2$ target 1 for 320 sec to deposit a 93 nm thick CaF$_2$ film on an end-face of the wafer. The holder 3 was then rotated to the TiO$_2$ target 2 and held for 410 sec to deposit a 56 nm thick TiO$_2$ film. We repeated three times the above process of alternately depositing a CaF$_2$ film and a TiO$_2$ film on the end-face of the wafer to form a reflector of a λ/4 alternately deposited multilayer film on the end-face of the laser wafer. A reflectance of 93% was attained at 519 nm.

Pulse driving at 300 K of the laser device where a similar dielectric reflector was formed on the other end-face confirmed laser oscillation at 519 nm, which exhibited a threshold current of 140 mA and a threshold current density of 1.6 kA/cm$^2$.

When we changed the number of repetitions of alternately depositing a CaF$_2$ film and a TiO$_2$ film from two to ten, the reflectance varied from 82.0 to 99.99%, accordingly. The threshold current of the laser oscillation decreased with increasing reflectance.

We did not detect cracks, strains or absorption caused by impurities in use of a reflector made by ten repetitions of the alternate deposition, confirming that the reflector was of high quality for the semiconductor laser device. Reflectors free from cracks and strains were formed within substrate temperatures from 20° to 150° C.

Example 8

With the electron beam evaporating apparatus, we formed a reflector of CaF$_2$ —HfO$_2$ films alternately deposited on a ZnSe II-VI group compound semiconductor laser device.

A CaF$_2$ target 1 and an HfO$_2$target 2 were used as evaporating sources. The ZnSe semiconductor laser device used was anticipated to have an oscillating wavelength of 503 nm at 300 K.

The degree of vacuum was 1.0×10$^{-4}$ Pa, the substrate temperature was 50° C., and the evaporation rate was 0.5 nm/sec. The resulting CaF$_2$ film and HfO$_2$ film in the oscillating wavelength region exhibited a refractive index of 1.40 and 1.98, respectively.

First, a 90 nm thick CaF$_2$ film was deposited on an end-face of a wafer. Then, a 64 nm thick HfO$_2$ film was deposited thereon. We repeated four times the above process of alternately depositing a CaF$_2$ film and an HfO$_2$ film on the end-face of the wafer to form a reflector of a λ/4 alternately deposited multilayer film on the end-face of the laser wafer. A reflectance of 91% was attained at 503 nm.

Pulse driving at 300 K of the laser device where a similar dielectric reflector was formed on the other end-face confirmed laser oscillation at 503 nm, which exhibited a threshold current of 200 mA and a threshold current density of 1.4 kA/cm$^2$.

When we changed the number of repetitions of alternately depositing a CaF$_2$ film and an HfO$_2$ film from three to ten, the reflectance varied from 83.0 to 99.8%, accordingly. The threshold current of the laser oscillation decreased with increasing reflectance.

We did not detect cracks, strains, and absorption caused by impurities in use of a reflector made by ten repetitions of the alternate deposition, confirming that the reflector was of high quality for the semiconductor laser device. Reflectors free from cracks and strains were formed within substrate temperatures from 20° to 150° C.

Example 9

With the electron beam evaporating apparatus, we formed a reflector of Al$_2$O$_3$—TiO$_2$ films alternately deposited on a ZnSSe II-VI group compound semiconductor laser device.

An Al$_2$O$_3$ target 1 and a TiO$_2$ target 2 were used as evaporating sources. The ZnSSe semiconductor laser device used was anticipated to have an oscillating wavelength of 531 nm at 300 K.

The degree of vacuum was 1.5×10$^{-4}$ Pa. The substrate used was subjected to oxygen irradiation, and the substrate temperature was 50° C. . The evaporation rate was 0.5 nm/sec. The resulting Al$_2$O$_3$ film and TiO$_2$ film in the oscillating wavelength region exhibited a refractive index of 1.57 and 2.35, respectively.

First, an 85 nm thick Al$_2$O$_3$ film was deposited on an end-face of a wafer. Then, a 56 nm thick TiO$_2$ film was deposited thereon. We repeated four times the above process of alternately depositing an Al$_2$O$_3$ film and a TiO$_2$ film on the end-face of the wafer to form a reflector of a λ/4 alternately deposited multilayer film on the end-face of the laser wafer. A reflectance of 94% was attained at 531 nm.

Pulse driving at 300 K of the laser device where a similar dielectric reflector was formed on the other end-face confirmed laser oscillation at 531 nm, which exhibited a threshold current of 210 mA and a threshold current density of 1.8 kA/cm$^2$.

When we changed the number of repetitions of alternately depositing an Al$_2$O$_3$ film and a TiO$_2$ film from 3 to 10, the reflectance varied from 87.0 to 99.9%, accordingly. The threshold current of the laser oscillation decreased with increasing reflectance.

We did not detect cracks, strains, and absorption caused by impurities in use of a reflector made by ten repetitions of the alternate deposition, confirming that the reflector was of high quality for the semiconductor laser device. Reflectors free from cracks and strains were formed within substrate temperatures from 20° to 150° C. .

As described above, the present embodiments provided an ideal dielectric reflector with less light loss on an end-face of a semiconductor laser device having an oscillating wavelength of 370 to 600 nm formed of a II–VI or III–V group compound.

The reflector production technology realized by the invention is essential for short-wavelength semiconductor laser devices, and it is extremely useful in practical application.

The invention may be embodied in other specific forms without departing from the spirit or essential characteristics thereof. The disclosed embodiments are to be considered in all respects as illustrative and not restrictive, the scope of the invention being indicated by the appended claims rather than by the foregoing description and all changes which come within the meaning and range of equivalency of the claims are intended to be embraced therein.

What is claimed is:

1. A reflector for an end-face of a semiconductor laser device comprising at least two dielectric films having a refractive index different from each other deposited on the end-face of a semiconductor laser device having an oscillating wavelength from 370 to 600 nm.

2. A reflector according to claim 1, wherein said semiconductor laser device is formed of a II–VI group compound.

3. A reflector according to claim 2, wherein said II–VI group compound is used as a single substance or a mixed crystal of at least one compound selected from zinc sulfide (ZnS), zinc selenide (ZnSe), zinc telluride (ZnTe), cadmium sulfide (CdS) and cadmium selenide (CdSe).

4. A reflector according to claim 1, wherein said dielectric films comprise a first film formed of at least one compound selected from the group consisting of calcium fluoride ($CaF_2$), magnesium fluoride ($MgF_2$), thorium (IV) fluoride ($ThF_4$), silicon dioxide ($SiO_2$) and aluminum oxide ($Al_2O_3$), and a second film formed of at least one compound selected from the group consisting of zinc sulfide (ZnS), zirconlure (IV) oxide ($ZrO_2$), hafnium (IV) oxide ($HfO_2$), cerium (IV) oxide ($CeO_2$) and titanium (IV) oxide ($TiO_2$), and said first and second films are alternately deposited one over another.

5. A reflector according to claim 1 or 4, wherein said dielectric films each have an optical thickness equal to a quarter of an oscillating wavelength of said semiconductor laser device.

6. A reflector according to claim 1 or 4, wherein the number of said dielectric films alternately deposited is from 4 to 30.

7. A method of manufacturing a reflector for an end-face of a semiconductor laser device comprising the steps of alternately and continuously depositing at least two dielectric films on an end-face of a II–VI group compound semiconductor laser device in a vacuum chamber.

8. A method according to claim 7, wherein said dielectric films are deposited on a substrate kept at a temperature from 20° to 150° C.

9. A method according to claim 7 or 8, wherein the steps of alternately and continuously depositing at least two dielectric films comprise repetitions from 2 to 10 times of depositing a first dielectric film to an optical thickness equal to a quarter of an oscillating wavelength of said semiconductor laser device and depositing a second dielectric film to the same optical thickness as that of said first dielectric film.

10. A method according to claim 9, wherein said first dielectric film and said second dielectric film are formed of a first compound and a second compound, respectively, and said first and second compounds are selected from the pairs of $SiO_2$ and $TiO_2$; $SiO_2$ and $ZrO_2$; $SiO_2$ and ZnS; $MgF_2$ and ZnS; $ThF_4$ and ZnS; $MgF_2$ and $CEO_2$; $CaF_2$ and $TiO_2$ $CaF_2$ and $HfO_2$; and $Al_2O_3$ and $TiO_2$.

11. A method according to claim 9, wherein said first dielectric film is formed from a compound selected from the group consisting of $CaF_2 MgF_2 ThF_4 SiO_2$ and $Al_2O_3$, and said second film is formed from a compound selected from the group consisting of ZnS, $ZrO_2$, $HfO_2$, $CeO_2$ and $TiO_2$.

* * * * *